United States Patent [19]

Ohtaka et al.

[11] Patent Number: 4,567,123
[45] Date of Patent: Jan. 28, 1986

[54] DIFFUSING PLATE

[75] Inventors: Keiji Ohtaka, Tokyo; Takashi Suzuki; Kiyoshi Iizuka, both of Yokohama; Hidemasa Mizutani, Kawasaki, all of Japan

[73] Assignee: Canon Kabushiki Kaisha, Tokyo, Japan

[21] Appl. No.: 694,910

[22] Filed: Jan. 25, 1985

Related U.S. Application Data

[60] Division of Ser. No. 514,306, Jul. 15, 1983, abandoned, which is a continuation-in-part of Ser. No. 351,991, Feb. 24, 1982, abandoned.

[30] Foreign Application Priority Data

Mar. 11, 1981 [JP] Japan .................. 56-34712

[51] Int. Cl.⁴ ............... G03F 7/00; G03F 7/16; G02B 11/00; G02B 13/20
[52] U.S. Cl. .................. 430/4; 264/1.4; 264/2.5; 427/135; 430/321; 430/324; 350/417; 350/431
[58] Field of Search .................. 430/4, 321, 324; 350/417, 431; 264/1.4, 2.5; 427/135

[56] References Cited

U.S. PATENT DOCUMENTS

| 2,399,799 | 5/1946 | Guellich | 430/321 |
| 3,277,541 | 10/1966 | Wilton | 430/320 |
| 4,430,401 | 2/1984 | Wilkinson | 430/324 |
| 4,523,807 | 6/1985 | Suzuki et al. | 350/128 |

FOREIGN PATENT DOCUMENTS 54-83846 7/1979 Japan.
55-90931 7/1980 Japan.

Primary Examiner—Richard L. Schilling
Attorney, Agent, or Firm—Fitzpatrick, Cella, Harper & Scinto

[57] ABSTRACT

A diffusing plate having a smooth rough surface is obtained by recording on a photosensitive material the image of a mask having a regular fine pattern thereon, treating the photosensitive material to thereby obtain a photosensitive material having smooth roughness, transferring the smooth roughness of the treated photosensitive material to a metal mold, and embossing plastics on the metal mold.

3 Claims, 11 Drawing Figures

DIFFUSING PLATE

RELATED APPLICATIONS

This application is a division of application Ser. No. 514,306 filed July 15, 1983 now abandoned, which in turn is a continuation-in-part application of original application U.S. Ser. No. 351,991 filed Feb. 24, 1982, now abandoned.

BACKGROUND OF THE INVENTION

1. Field of the Invention

This invention relates to a diffusing plate suitable for use as the focusing screen or the like of a camera and having a special diffusing characteristic.

1. Description of the Prior Art

Focusing screens manufactured by using a mold having a sand-brushed metal surface and transferring the roughness of the metal surface of the mold to acryl plates have been widely used as the focusing screens of single lens reflex cameras. The focusing screen made by such manufacturing method has a surface cross-sectional shape which is sharply rough as shown in FIG. 1 of the accompanying drawings. The image of an object to be photographed is dark thereon and particles of light appear to be superposed on the image of the object. To overcome these disadvantages peculiar to the prior art focusing screen, diffusing plates having a smooth rough surface have been devised as described in Japanese Laid-Open Patent Application Nos. 42726/1978 and 92232/1979. In such a diffusing plate having a smooth rough surface is obtained by forming a speckle pattern on a sensitive material, treating this sensitive material to obtain a photosensitive material having a smooth rough surface, transferring the smooth roughness of this photosensitive material to a metal mold, and embossing plastics on this metal mold. The diffusing plate obtained by this manufacturing method, as compared with the focusing screen obtained by the sand-brushing, may result in a bright and less granular focusing screen, but it still suffers from a disadvantage that its granularity becomes remarkable as the aperture becomes smaller. Such granularity is attributable to the fact that the arrangement of the smooth roughness is random.

A diffusing plate having regularly arranged smooth or continuous roughness is described in Japanese Laid-open Patent Application No. 83846/1979. The method for manufacturing this diffusing plate comprises bringing a mask having a regular fine pattern recorded thereon into intimate contact with photoresist applied to a metal plate to transfer the fine pattern of the mask to the photoresist, removing the exposed or unexposed portion of the photoresist, etching the exposed metal portion to thereby obtain a metallic mold having smooth roughness, and embossing plastics on this metal mold to thereby obtain a diffusing plate. However, this method has encountered a difficulty in controlling the size of the roughness and the smoothness and has offered a problem with respect to reproducibility.

Another method of manufacturing a diffusing plate having regularly arranged smooth roughness is described in Japanese Laid-open Patent Application No. 90931/1980. This method comprises exposing a silver salt photosensitive material applied to a glass substrate to a regular interference pattern formed by the interference of a laser beam, developing the photosensitive material, subjecting it to a bleach treatment, transferring the roughness on the photosensitive plate obtained thereby to obtain a metal mold, and embossing plastics on the metal mold to obtain a diffusing plate. However, this method has suffered from the problem that it uses a largescale laser.

SUMMARY OF THE INVENTION

The present invention provides a diffusing plate having preferable characteristics as a focusing screen for a camera, namely, the plate is bright and free of granularity, by using a manufacturing method different from the above-described prior art methods. The diffusing plate of the present invention may be obtained by converting a regular fine structural pattern image into a smooth or continuous roughness distribution on a photosensitive material, making a mold having a fine roughness structure of the surface of the obtained sensitive material by electrotyping, and transferring the same to an optical material such as transparent resin or the like.

The invention will become more fully apparent from the following detailed description thereof taken in conjunction with the accompanying drawings.

DESCRIPTION OF THE PREFERRED EMBODIMENT

Figure 1:
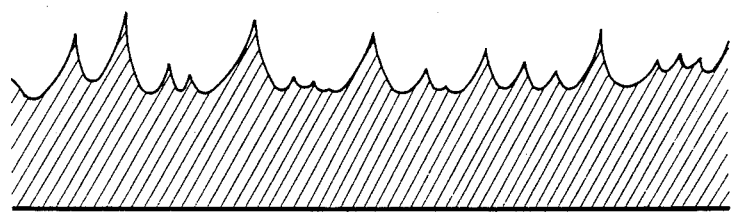
FIG. 1 is a sectional view of a focusing screen obtained by sand-brushing.
Figure 2:
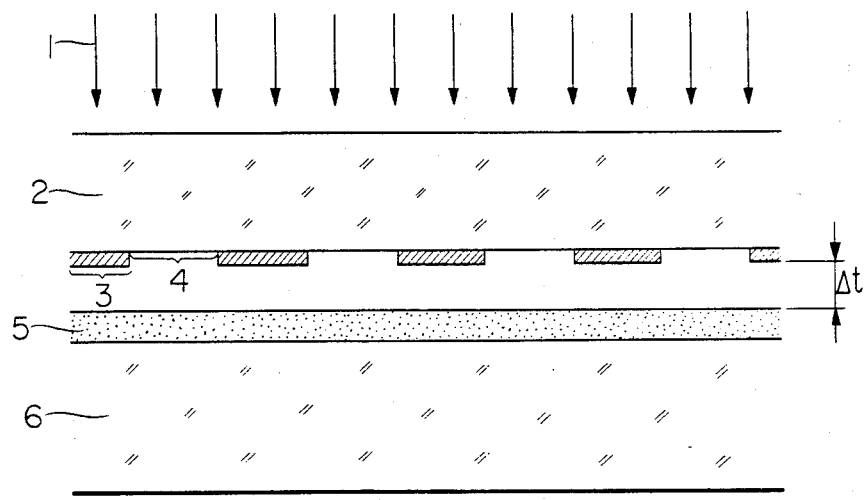
FIG. 2 is a sectional view illustrating the manner in which a mask having a fine structural pattern thereon is exposed to light while being opposed to the surface of a dry-plate.
Figure 3A:
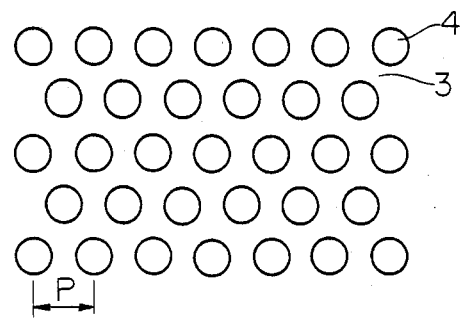
FIGS. 3A and 3B are plan views of masks having regular fine structures.
Figure 3B:
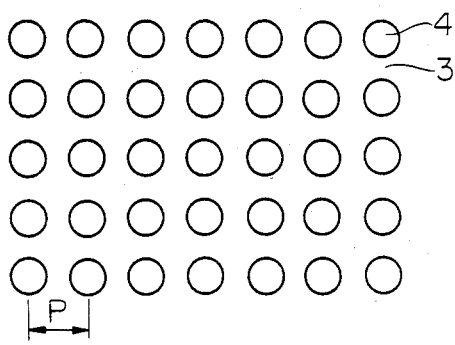
Figure 4A:
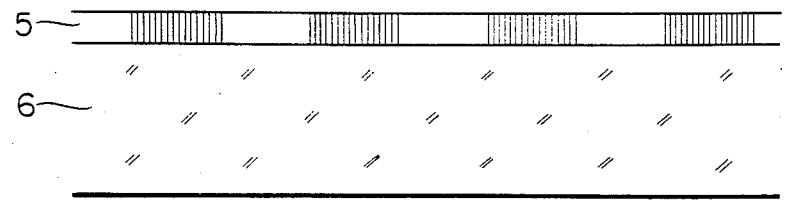
FIGS. 4A and 4B are sectional views of dry-plates subjected to development after exposure.
Figure 4B:
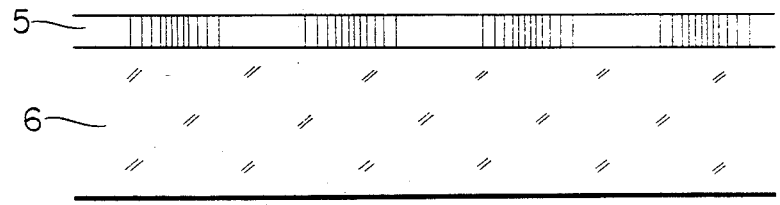

FIGS. 2-5 illustrate the manufacturing process of the focusing screen of the present invention by the bleach treatment of a gelatin dry-plate. FIG. 2 shows a condition in which a mask 2 having a fine pattern thereon is opposed to the surface of the emulsion layer 5 of a photographic dry-plate 6 with an interval $\Delta t$ therebetween and exposed to light rays 1. Including the case of intimate contact, $\Delta t$ is of the order of 0 $\mu$m to several tens of $\mu$m and is variable by the coherency of the light to which the mask is exposed. If a regular pattern is illuminated by a light of good coherence such as a high pressure mercury lamp, a so-called Fresnel image or Fourier image is created at a location spaced apart from the pattern surface. Accordingly, light rays of better coherence are used, so that $\Delta t$ can be selected to have a greater value. FIGS. 3A and 3B are plan views showing two specific examples of the regular fine pattern 4 on the mask 2, the pitch P of the regular fine pattern being of the order of 10-25 $\mu$m. FIG. 4 shows a condition in which the dry-plate exposed to light by the method of FIG. 2 has been developed, FIG. 4A showing a case where Δt is small and FIG. 4B showing a case where Δt is great and the boundary between black and white is blurred under the influence of diffracted light.

Where Δt is small as in the case of intimate contact, a light distribution image of the rectangular transmission factor distribution itself of the mask is formed on the dry-plate. In such a case, the sensitive material itself must have the function of converting the rectangular light distribution image into a smooth roughness distribution. As an example of the photosensitive material having the above-described characteristic, photoresist may be mentioned, but a similar roughness distribution can be obtained also by bleach treatment of a gelatin dry-plate.

If the photosensitive material is one which faithfully converts a light distribution into a roughness distribution, the transmission factor distribution of the mask must be made into one having an intermediate transmission factor distribution instead of a rectangular one.

Figure 5A:
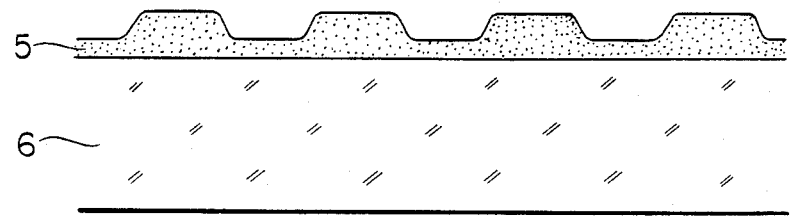
FIGS. 5A and 5B are sectional views of dry-plates subjected to the bleach treatment after development.
Figure 5B:
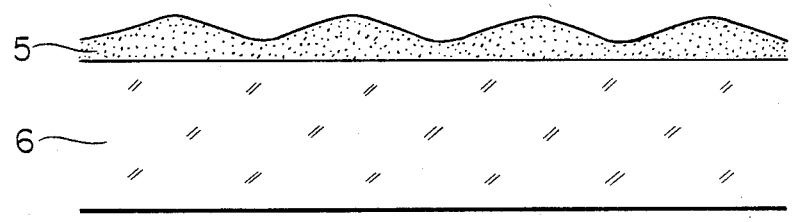
Figure 7:
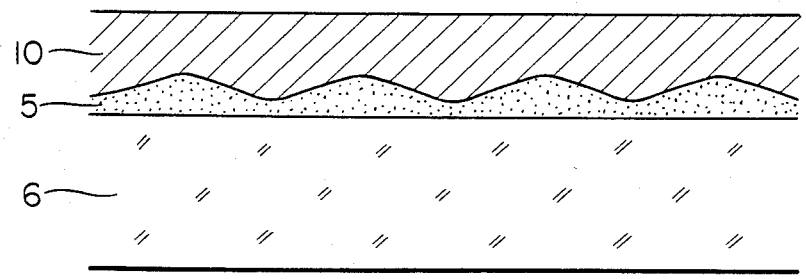
FIG. 7 is a view illustrating the step of transferring onto a metal layer the pattern formed on the dry-plate after bleach treatment shown in FIG. 5B.
Figure 8:
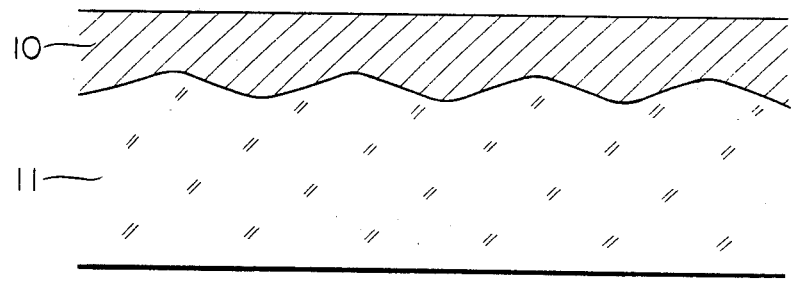
FIG. 8 is a view illustrating the step of transferring onto an acrylic resin material the pattern on the metal layer which has been transferred thereto from the dry-plate.

FIG. 5 shows the developed dry-plate of FIG. 4 which has been subjected to the bleach treatment, and illustrates a condition in which the dry-plate has been bleached and the concentration distribution of black and white has been converted into a roughness distribution of the surface of the emulsion layer. FIGS. 5A and 5B correspond to FIGS. 4A and 4B, respectively, and show that as Δt becomes greater, the rough configuration of the surface changes from FIG. 5A to FIG. 5B. From the roughness distribution thus formed on the gelatin dry-plate surface, a mold is formed by, e.g., electroforming. FIG. 7 shows this step. Denoted by 10 in FIG. 7 is a metal layer, and the mold is formed by removing the dry-plate from the metal layer 10. Subsequently, a transparent material 11 such as acrylic resin is applied to the mold 10 as shown in FIG. 8, so that the roughness distribution is transferred onto the transparent resin 11, whereby a diffusing plate or focusing screen of the present invention is finally obtained.

As the above-described bleach method, there is known the R-10 bleach method (J. H. Altman, *Appl. Opt.* 5 [10], 1689 (1966)), the reversal bleach method using potassium bichromate, the potassium ferricyanide bleach method (Okayama et al., *Applied Physics* 40 [11], 1209 (1971)), the R-24 bleach method (F. Bestenreiner et al., *Photographic Science and Engineering* 14 [1], 1 (1970)), or the bleach method using a tanning developing liquid (R. L. Lamberts and C. N. Kurtz, *Appl. Opt.* 10 [6], 1342 (1971)).

The manufacturing process of the focusing screen of the present invention by the bleach treatment of a gelatin dry-plate has been described above, but photoresist can also be used as the sensitive material. The exposure in the case of photoresist can be accomplished just in the same manner by replacing the emulsion layer 5 with photoresist in FIG. 2. By the subsequent developing treatment, the exposed portion is dissolved in the case of positive type photoresist and the unexposed portion is dissolved in the case of negative type photoresist, whereby a roughness distribution similar to that of FIG. 5 is obtained in accordance with the mask pattern. The relation between the amount of exposure and the thickness of the photoresist layer may exhibit either linearity or nonlinearity depending on the photoresist used and the developing treatment method, and can be selected in accordance with the roughness distribution to be obtained. Specific data regarding these can be found in many articles in the literature (R. G. Brandes and R. K. Curran, *Appl. Opt.* 10 [9], 2101 (1971); Robert A. Bartolini, *Appl. Opt.* 11 [5], 1275 (1972); R. A. Bartolini, *Appl. Opt.* 13 [1], 129 (1974); S. L. Norman and M. P. Singh, *Appln. Opt.* 14 [4], 818 (1975)).

In the diffusing plate according to the present invention, as described above, the image of a fine structural pattern is formed on the surface of the sensitive material and therefore, a diffusing plate of a desired diffusing characteristic can be easily obtained by artificially providing a desirable fine structural pattern.

Figure 6:
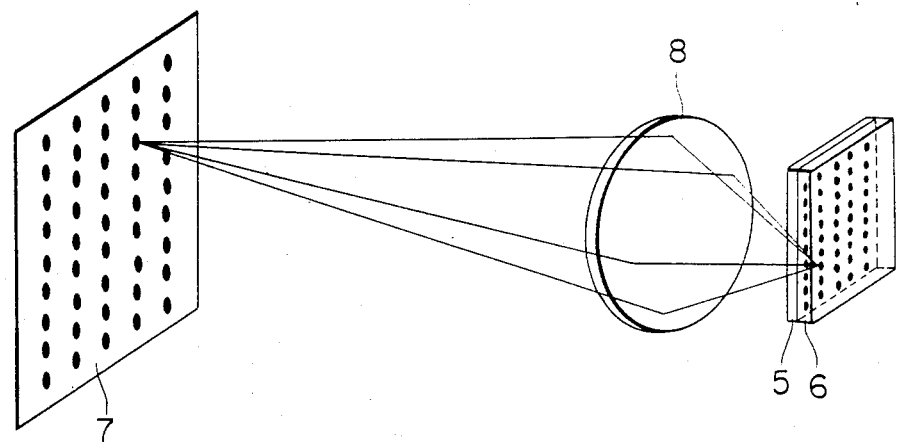
FIG. 6 is a view illustrating the manner in which an original having a regular structural pattern therein is projected.

As described in connection with FIG. 2, as a method of forming the fine pattern on the surface of the sensitive material, there is a method comprising bringing a mask having a fine pattern thereon into intimate contact with the surface of the sensitive material or opposing such mask to the surface of the sensitive material with an interval of several $\mu$ to several tens of $\mu$m therebetween, and in addition, a method of projecting an original 7 having a desired regular pattern thereon by the use of an optical system 8 as shown in FIG. 6 would come to mind. Particularly, according to this method, the images of fine patterns of various pitches can be easily formed from a single original by varying the magnification of projection.

Also, the mask 2 having the fine pattern used in the method shown in FIG. 2 can be likewise obtained by photographing an original having a regular pattern thereon, and just as previously described, a mask having fine patterns of various pitches can be easily obtained by changing the photographing magnification. In the making of such a mask, the step-and-repeat method may be adopted or reduction or enlargement may be repeated over two or more steps, as required.

On the other hand, the above-described original having the regular pattern can actually be depicted on the desk where the enlargement magnification for the fine pattern thereof is great, but in practice, it would occur to mind to cause a computer to generate a desired figure and cause a terminal device to put out it. As a specific method, there can be adopted a method of causing an automatic drawing instrument having mounted thereon a cutting edge instead of a pen to put out a figure on a strip coat and stripping off unnecessary portions or a method of causing a photoplotter to exposure and put out a figure onto a film and developing the same.

What has been described above shows the epitome and embodiments of the method and the details of the method should be selected in connection with the various properties of the diffusing plate to be obtained.

What we claim is:

1. A method of making a diffusing plate having continuous roughness, said method comprising the steps of:
    exposing a photosensitive material to image light of a mask having a regular fine pattern;
    treating said photosensitive material to form regular, continuous roughness on the surface thereof;
    forming a mold having said regular, continuous roughness on the surface thereof by coating said regular, continuous roughness formed on the surface of said photosensitive material with metal; and
    embossing an optical material on said metal mold.

2. A method according to claim 1, wherein the pitch of the regular fine pattern of said mask is about 10 to about 25 $\mu$m.

3. A method according to claim 1, wherein said mask has a rectangular transmission factor distribution and is disposed at a distance of several $\mu$m to several tens of $\mu$m from the surface of said photosensitive surface.

* * * * *